United States Patent [19]

Chishiki

[11] Patent Number: 5,519,665

[45] Date of Patent: May 21, 1996

[54] SEMICONDUCTOR MEMORY DEVICE HAVING WORD LINE DRIVER REQUIRING SINGLE WORD LINE DRIVE SIGNAL

[75] Inventor: Shigeo Chishiki, Tokyo, Japan

[73] Assignee: NEC Corporation, Tokyo, Japan

[21] Appl. No.: 336,192

[22] Filed: Nov. 4, 1994

[30] Foreign Application Priority Data

Nov. 4, 1993 [JP] Japan ................................. 5-298907

[51] Int. Cl.⁶ .................................................. G11C 8/00
[52] U.S. Cl. .............................. 365/230.06; 365/230.03; 365/203
[58] Field of Search ...................... 365/230.03, 230.06, 365/218, 189.09, 189.11, 203

[56] References Cited

U.S. PATENT DOCUMENTS

4,789,967 12/1988 Lion et al. ..................... 365/230.03

*Primary Examiner*—Joseph A. Popek
*Attorney, Agent, or Firm*—Popham, Haik, Schnobrich & Kaufman, Ltd.

[57] ABSTRACT

A semiconductor memory device includes at least one word line, at least one memory cell coupled to the word line, a decoder circuit responding to address information to generate a word line drive signal taking one of an active level and an inactive level, a signal generator generating a reset signal tacking an active level in a reset mode and an inactive level in a selection mode, and a word line driver coupled to receive the word line drive signal and the reset signal and to the word line. The word line driver includes a first drive circuit responding to the active level of the reset signal to drive the word line to a non-selection level and maintaining the word line at the non-selection level when the word line drive signal and the reset signal are at the inactive level. A second drive circuit responds to the active level of the word line drive signal and the inactive level of the reset signal to drive the word line to a selection level.

8 Claims, 10 Drawing Sheets

SEMICONDUCTOR MEMORY DEVICE HAVING WORD LINE DRIVER REQUIRING SINGLE WORD LINE DRIVE SIGNAL

BACKGROUND OF THE INVENTION

1. Field of the Invention

The present invention relates to a semiconductor memory device, and more particularly, to a semiconductor memory device in which wiring patterns can be simplified and in which word lines are held at a predetermined potential level so as not to float.

2. Description of Related Art

The integrated density is remarkably increased in a semiconductor memory device with the advanced fine processing technology. Specifically, in a dynamic RAM (DRAM) in which the structure of a memory cell is very simple, the increase in the integrated density is remarkable. 16-Mbit DRAM is mass-produced at present and 64-Mbit DRAM is now being forwarded as a sample.

Figure 1:
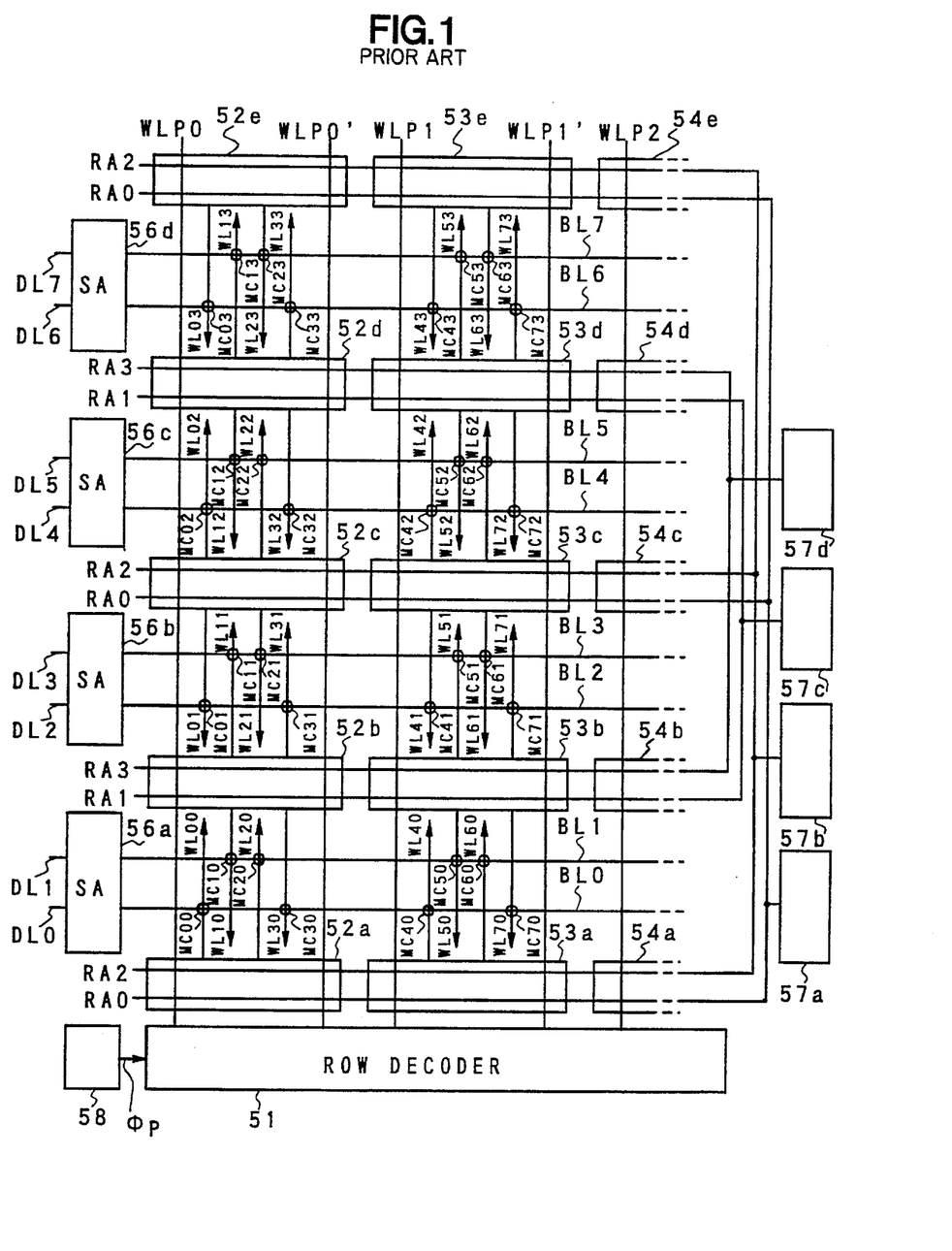
FIG. 1 is a block diagram showing a part of a conventional semiconductor memory device.

In the 64-Mbit DRAM there is proposed as one example a divisional decoding type of semiconductor memory device in which each of word lines is divided into a plurality of sections such that memory cell can be accessed at a higher speed and a driver is provided for some of the divided sections. FIG. 1 is a block diagram showing such a divisional decoding type of semiconductor memory device.

Memory cells MCmn (m and n are integers and equal to or more than 0) are divided into a plurality blocks and a part of one block is shown in FIG. 1. The memory cells in each of the plurality of blocks is further divided into a plurality of subblocks, e.g.,there are the memory cells MC00, MC10, MC20 and MC30 in one subblock. A plurality of word line driving circuits 52a, 52b, . . . , 53a, 53b, . . . , 54a, 54b, are scatteredly provided in the block in a matrix manner. Sets of word line driving circuits in a row direction are respectively connected to sets of word line driving signal WLP0, WLP1, WLP2, . . . and word line reset signal WLP0', WLP1', WLP2', . . . , such that the word line driving circuits in one set are commonly supplied with the set of signals. A row decoder 51 decodes a part of a row address of an external address to generate the word line driving signals and word line reset signals in response to a word line precharge signal φP from a circuit 58 which also generates a bit line precharge signal (not shown). Drive current supply circuits 57a to 57d decode lower two bits of the row address to generate word line selection signals RA0, RA1, RA2 and RA3 in accordance with the decoded result and supply word line driving current to sets of word line driving circuits, respectively. A pair of word line selection signals RA0 and RA2 and another pair of word line selection signals RA1 and RA3 are alternatively supplied to sets of word line driving circuits in a column direction. For instance, when the word line selection signal RA0 and the word line driving signal WLP0 are active, the circuit 57a supplies the drive current to the word line driving circuits 52a, 52c and 52e, so that the word lines WL00, WL01, WL02 and WL03 are driven. A sense amplifier (SA) 56a, 56b, 56c or 56d is provided for each of sets of subblocks of memory cells in the column direction. A pair of bit lines BL0 and BL1, BL2 and BL3, . . . is connected to each of the sense amplifiers and each memory cell is arranged at the intersection of the word line and the bit line. A dummy cell (not shown) is connected to one bit line of a pair opposing to the other bit line connected to the memory cell. For instance, with respect to a memory cell MC00 the dummy cell is constituted at the intersection of the bit line BL1 and a word line WL00 from the word line driving circuit 52a. Data is sensed from the dummy cell and the memory cell MC00 by the sense amplifier 56a and outputted onto the data lines DL0 and DL1.

Figure 2:
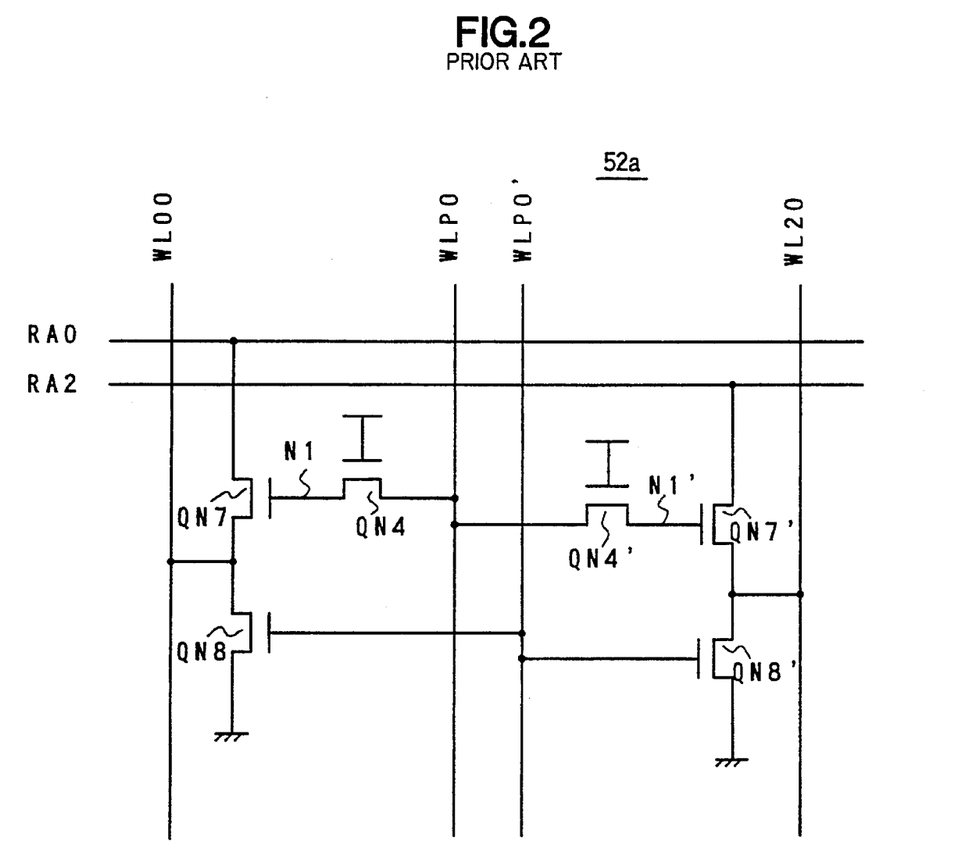
FIG. 2 is a block diagram showing a word line driving circuit shown in FIG. 1.

All of the word line driving circuits have the same configuration and FIG. 2 is a block diagram showing the word line driving circuit 52a as a representative one of the word line driving circuits. The word line driving circuit 52a includes two self-booting types of driving circuits as shown in FIG. 2. More particularly, the word line driving circuit 52a includes two circuit parts and one includes transistors QN4, QN7 and QN8. The drain of the transistor QN4 is connected to the word line driving signal WLP0, the gate thereof is connected to a power supply line and the source thereof is connected to the gate of the transistor QN7. The drain of the transistor QN7 is connected to the word line selection signal RA0 and the source thereof is connected to the drain of the transistor QNS. The gate of the transistor QN8 is connected to the word line reset signal WLP0' and the source thereof is connected to the ground potential as a reset potential. Transistor QN4', QN7' and QN8' in the other circuit is similarly connected except that the drain of the transistor QN7' is connected to the word line selection signal RA2 in place of the signal RA0.

Figure 3:
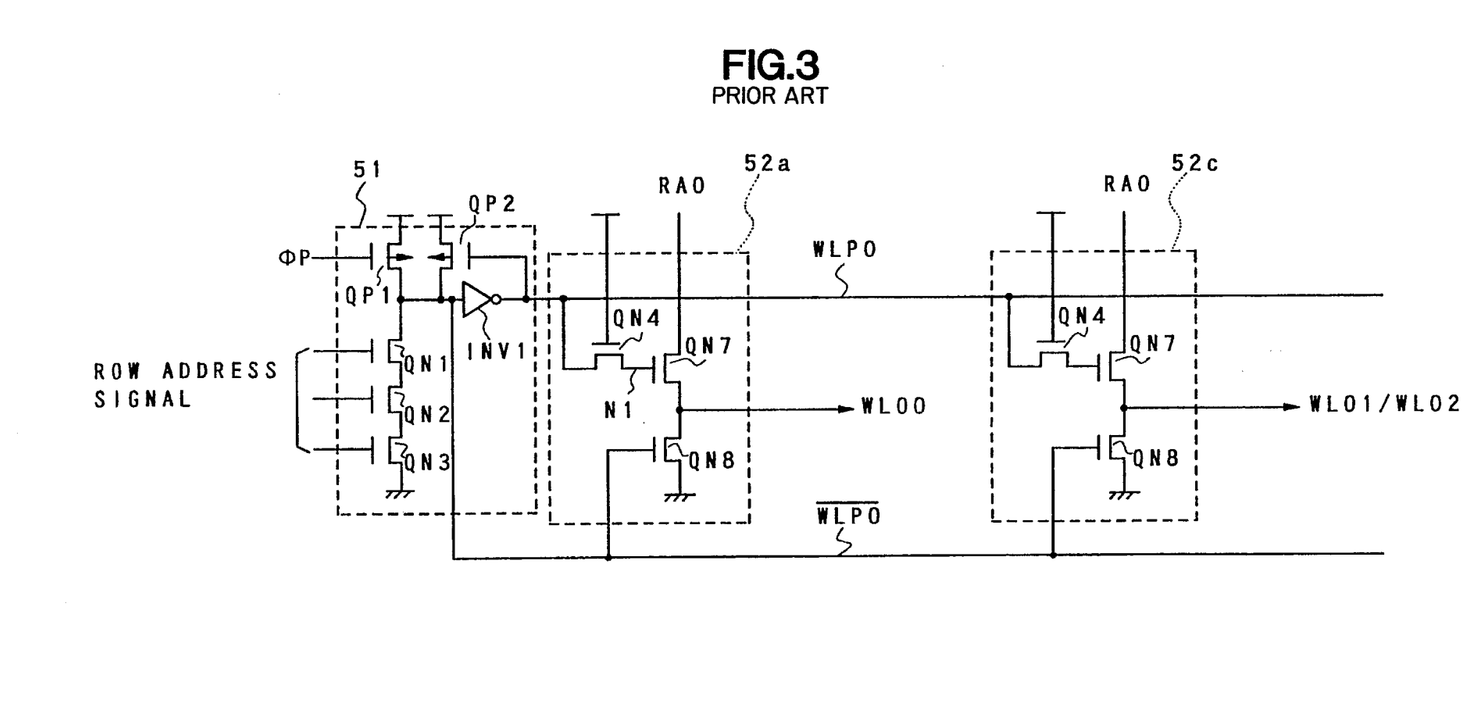
FIG. 3 is a schematic block diagram for describing the operation of the conventional semiconductor memory device.

FIG. 3 is a block diagram schematically showing the row decoder 51 and the word line driving circuits 52a and 52c. The relation of the row decoder 51 and the other word line driving circuits is the same. With reference to FIGS. 4A to 4F, the operation of the semiconductor memory device will be described below.

In a reset mode, all of the word line precharge signal φp, a row address signal, the word line selection signal RA0 and the word line WL00 is in the ground potential level as the reset potential. The word line driving signal WLP0 and the word line reset signal WLP0' are complementary and the signal WLP0' is in the power supply potential level because a P-type transistor QP2 (FIG. 3) is turned on while the signal WLP0 is in the ground potential level because of an inverter INV1. Since the signal WLP0 is in the ground potential level, the transistor QN7 is in the OFF state and because the transistor QN8 is in the ON state because of the signal WLP0', the word line WL00 is in the ground potential level.

Figure 4A:
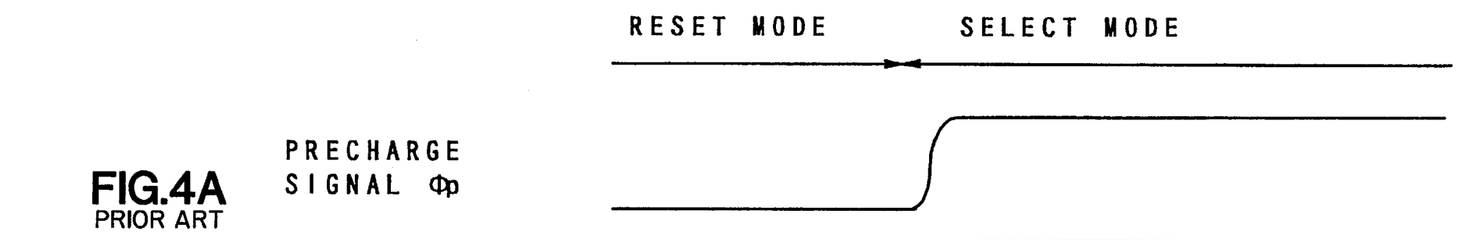
FIGS. 4A to 4F are timing charts for describing the operation of the conventional semiconductor memory device.
Figure 4B:
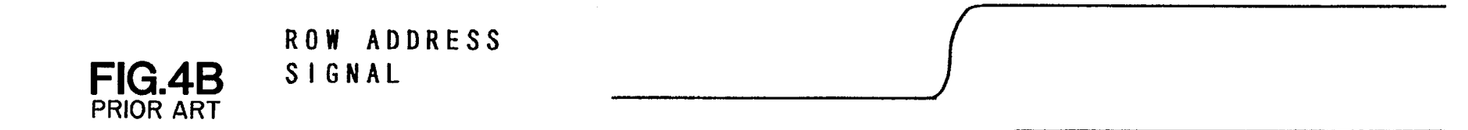
Figure 4C:
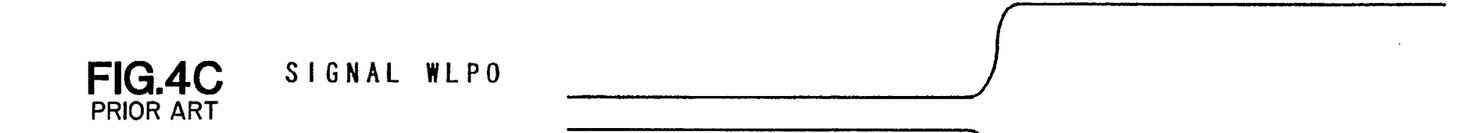

Next, when the memory cells are to be selected in accordance with the external address, i.e., in a select mode, the circuit 58 decodes a part of an external address which designates one block to generate the word line precharge signal φP which is raised to the power supply potential level as shown in FIG. 4A. After a p-type transistor QP1 goes completely to the OFF state, the row address signal is activated in the row decoder 51 by decoding a row address of the external address other than lower 2 bits as shown in FIG. 4B. If the word line driving signal WLP0 is to be selected, transistors QN1 to QN3 changes to the ON state in response to the row address signal, so that the signal WLP0' goes to the ground potential level as shown in FIG. 4C. Also, the potential of a node N1 (FIG. 2) is charged to a potential Vcc–Vth because of the output WLP0 of the inverter INV1, where Vcc is the power supply potential and Vth is a threshold voltage of the transistor QN4.

Figures 4D, 4E, 4F:
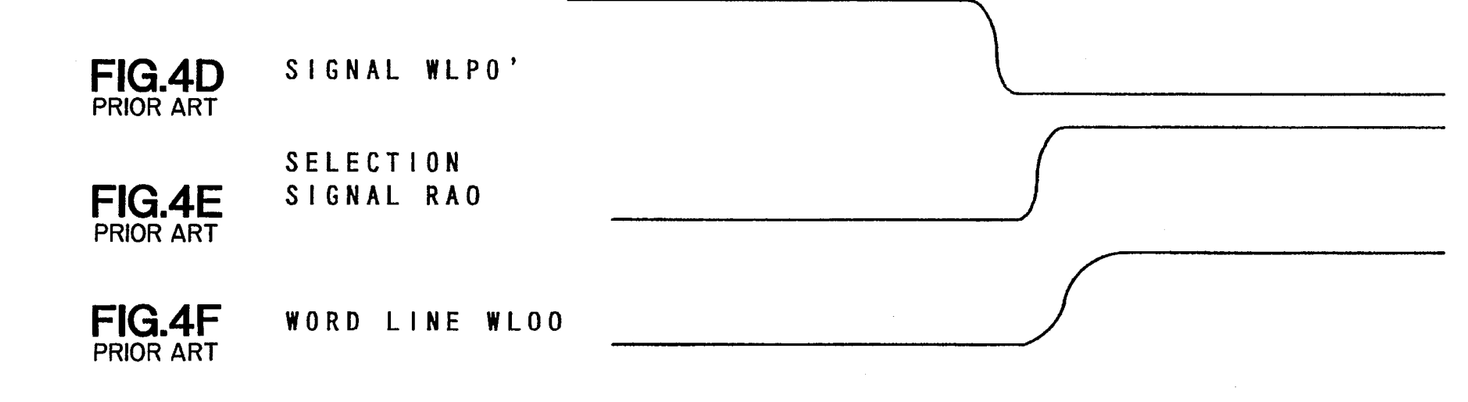

Next, when the selection signal RA0 is boosted in the drive current supply circuit 57a through decoding the lower 2 bits of the row address as shown in FIG. 4E, the self-booting of a transistor is caused so that the potential of the node N1 is raised to a further higher potential level than the boosted potential level of the selection signal RA0 to raise the potential level of the word line WL00 to the same level as that of the signal RA0, as shown in FIG. 4F.

The similar operation is performed in the word line driving circuits 52c and 52e so that the word lines WL01. WL02 and WL03 are activated.

In this manner, when one word line driving signal, e.g., the signal WLP0 is activated, the divisional word lines, e.g., the word lines WL00, WL01, WL02 and WL03 are selected based on the selection signal RA0 at a time so that the memory cells connected to the activated divisional word lines can be selected. Data of each memory cell is transferred to the sense amplifier as well as data of the corresponding dummy cell and the data is sensed there to be outputted onto the data lines.

When the access to the memory cells is completed, the precharge signal φP and the row address signal are reset to the ground potential level so that the transistor QP1 changes to the ON state and the transistors QN1 to QN3 changes to the OFF state such that the signals WLP0 and WLP0' are inverted. When the word line reset signal goes to the power supply potential level and the word line driving signal goes to the ground potential level, the transistor QN7 changes to the OFF state and the transistor QN8 changes to the ON state. As the result, the word line WL00 goes to the ground potential level and is held at that level as the reset level.

As described above, in the divisional decoding type of semiconductor memory device including the word line driving circuits, the word lines are formed of polysilicon and the word line driving signal lines and the word line reset signal lines are formed of metal such as aluminium in parallel to the word lines. In this case, since the driving signal and the reset signal are complementary, when one is in the high potential level the other is in the low potential level.

Generally, the pitch between the word lines in the DRAM often takes a minimum distance which can be allowed in the manufacturing process. Therefore, the pitch between the driving signal line and the reset signal line is also not sufficient and there is a high possibility that a short circuit is formed between the driving signal line and the reset signal line because of contamination in a manufacturing process. In this case, the manufactured semiconductor memory device is fault in standby current.

In addition, with high integration in the DRAM, there are many cases that a memory cell is three-dimensionally formed for the capacitance of the memory cell as in the stacked memory cell. Therefore, a region forming the memory cells is provided to have a step for a region forming the peripheral circuit including the driving signal line and the reset signal line. On the other hand, for fine processing of the semiconductor memory device the numerical aperture of a lens in an exposing unit becomes greater and the wavelength of light becomes shorter so that the depth of focus becomes shallow. As a result of this, it is impossible to focus on the memory cell region and the peripheral region at a time. When the memory cell region is focused on, the resolution is wrong on the peripheral region. If the pitch between the driving signal line and the reset signal line is smaller, the patterns for them are not resolved so that the short circuit would be formed between them. If two processes are performed for the metal wiring of the memory cell region and the peripheral region to avoid such a case, the cost would increase.

If the number of memory cells is double in each subblock, the pitch between the driving signal line and the reset signal line can be widened. However, the driving current supply circuits such as the circuits 57a, 57b, . . . need large driving capability so that the size would becomes great. If the size is as it is, the access speed would be down.

SUMMARY OF THE INVENTION

It is therefore an object of the present invention to provide a semiconductor memory device having an improved word line driver.

Another object of the present invention is to provide a semiconductor memory device having an improved circuit construction not requiring a complementary signal of a word line drive signal.

A semiconductor memory device according to the present invention, includes:

at least one word line;

at least one memory cell coupled to the word line;

a decoder circuit responding to address information to generate a word line drive signal taking one of an active level and an inactive level;

a signal generator generating a reset signal tacking an active level in a reset mode and an inactive level in a selection mode; and a word line driver coupled to receive the word line drive signal and the reset signal and to the word line, and wherein the word line driver includes a first drive circuit responding to the active level of the reset signal to drive the word line to a non-selection level and maintaining the word line at said non-selection level when the word line drive signal and the reset signal are at the inactive level and a second drive circuit responded to the active level of the word line drive signal and the inactive level of the reset signal to drive the word line to a selection level.

With the circuit thus constructed, only one word line drive signal is required, and a complementary signal thereof is omitted. The standby current fault due to a short circuit is thereby removed. In this manner, according to the present invention, the semiconductor memory device can be manufactured with a high yield without remarkably increasing of the chip area.

DESCRIPTION OF THE PREFERRED EMBODIMENTS

The present invention will be described below with reference to the accompanying drawings.

Figure 5:
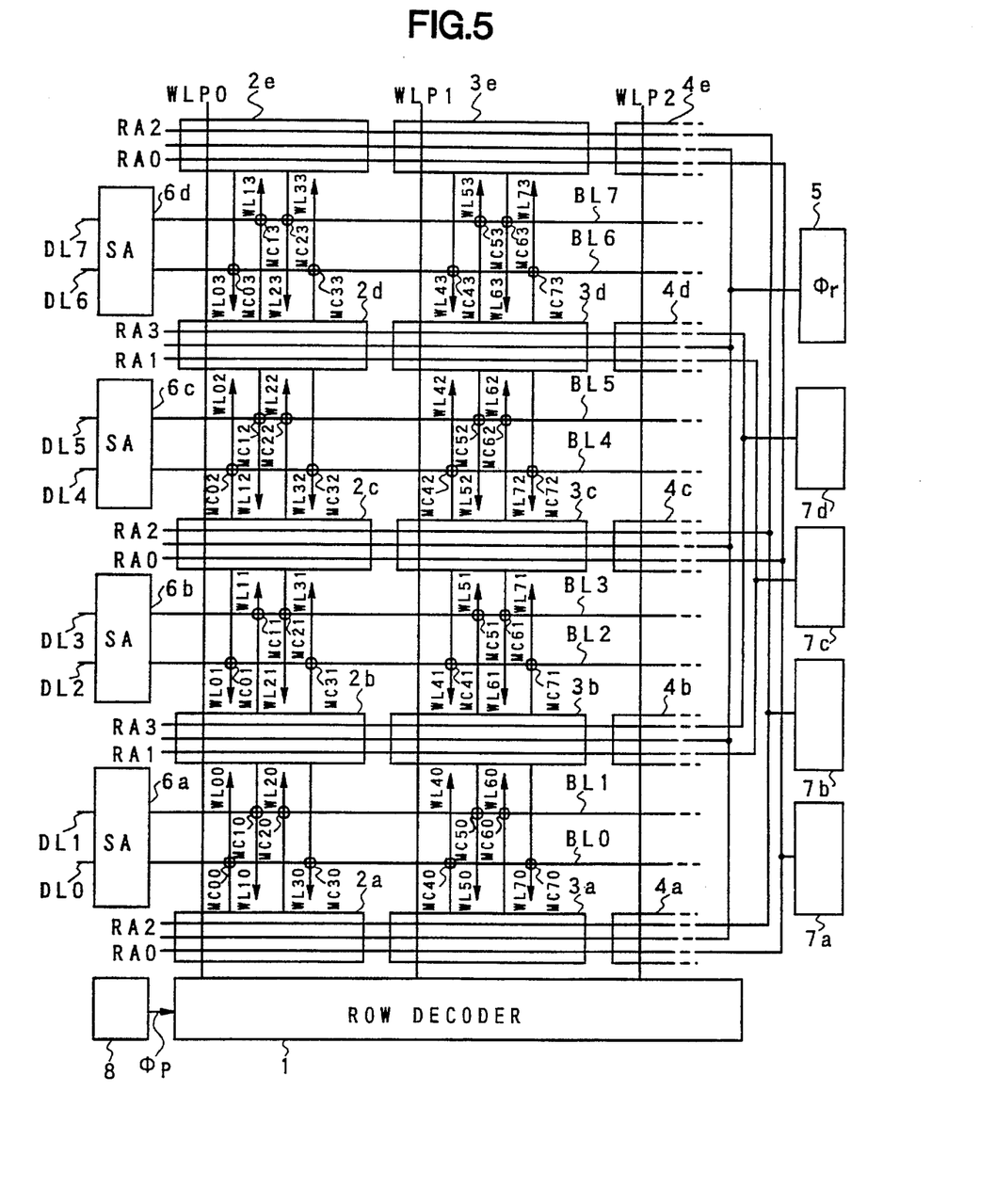
FIG. 5 is a block diagram showing a part of a semiconductor memory device according to an embodiment of the present invention.

FIG. 5 is a block diagram showing a semiconductor memory such as a dynamic random access memory according to an embodiment of the present invention. In the figure, memory cells MCmn (m and n are integers and equal to or more than 0) are divided into a plurality of blocks, a part of one of which is shown in FIG. 5. The memory cells in each of the plurality of blocks is further divided into a plurality of subblocks in a matrix manner. A plurality of word line driving circuits 2a, 2b, . . . , 3a, 3b, . . . , 4a, 4b, . . . are scatteredly provided in the block in a matrix manner in correspondence to the plurality of subblocks. Each of sets of word line driving circuits in a row or word line direction is commonly supplied with a word line driving signal WLP0, WLP1 or WLP2. A row decoder 1 decodes a part of a row address of an external address to generate the word line driving signal in response to a word line precharge signal φP from a precharging circuit 8 which decodes a part of a column address of the external address, i.e., an address corresponding to the block to generate the signal φP and a bit line precharge signal φBP (not shown in FIG. 5). In the present embodiment the row decoder 1 does not generate the word line reset signal and a reset circuit 5 is commonly provided for the word line driving circuits to supply a reset signal φr for resetting the selected word lines and holding them at the predetermined potential level. The reset circuit 5 decodes a part of the external address to generate the reset signal φr which is supplied to each of the word line driving circuits. Drive current supply circuits 7a to 7d decodes two bits of the row address to generate word line selection signals RA0, RA1, RA2 and RA3 in accordance with the decoded result. Word line drive current is supplied to the word line driving circuits as the selection signals from the circuits 7a to 7d. A pair of word line selection signals RA0 and RA2 and another pair of word line selection signals RA1 and RA3 are alternatively supplied to sets of word line driving circuits in a column direction. For instance, when the word line selection signal RA0 and the word line driving signal WLP0 are active, the word line driving circuits 2a, 2c and 2e become active to drive the word lines WL00, WL01, WL02 and WL03. A sense amplifier (SA) 6a, 6b, 6c or 6d is provided for each of sets of memory cell subblocks in the column direction. A pair of bit lines BL0 and BL1, BL2 and BL3, . . . is connected to each of the sense amplifiers and each memory cell is arranged at the intersection of the word line and the bit line. A dummy cell (not shown) is connected to one bit line opposing to the other bit line connected to the memory cell. For instance, with respect to a memory cell MC00 the dummy cell is constituted at the intersection of the bit line BL1 and a word line WL00 from the word line driving circuit 2a. Data is sensed from the dummy cell and the memory cell MC00 by the sense amplifier 6a and outputted onto the data lines DL0 and DL1.

Figure 6:
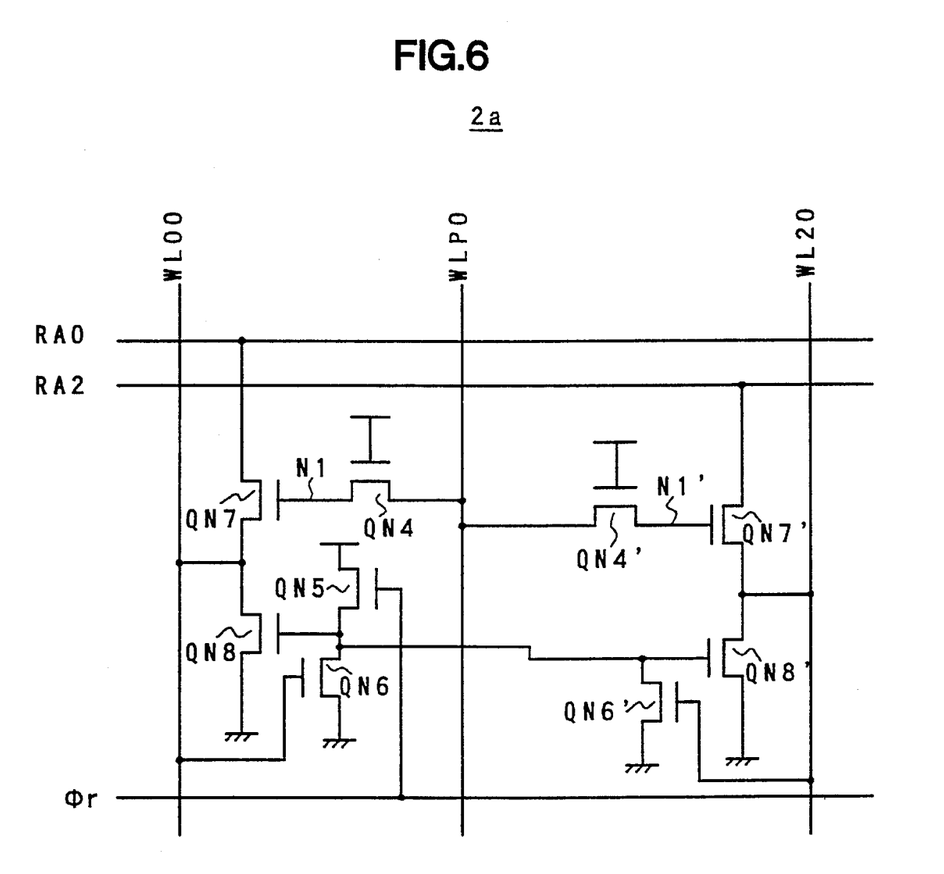
FIG. 6 is a block diagram showing a word line driving circuit shown in FIG. 5.

Next, the word line drive circuit will be described with reference to FIG. 6, taking the circuit 2a as an example. The other word line drive circuits are the same as the circuit 2a. The word line selection signals RA0 and RA2, the word line driving signal WLP0 and the reset signal φr are supplied from the drive current supply circuit 7a, the row decoder 1, and the reset circuit 5, respectively. Transistors QN7 and QN8 are connected in series between the signal line RA0 and the ground potential. A transistor QN4 is provided between the gate of the transistor QN7 and the signal line WLP0 and the gate thereof is connected to a power supply potential. The node between the transistors QN7 and QN8 is connected to a word line WL00. Transistors QN5 and QN6 are connected in series between the power supply potential and the ground potential. The node between the transistors QN5 and QN6 is connected to the gate of the transistor QN8 and the gate of the transistor QN6 is connected to the word line WL00 such that the transistors QN8 and QN6 constitute a flip-flop. The gate of the transistor QN5 is connected to the reset signal line φr. Transistors QN7', QN8', QN4' and QN6' are connected to one another in the same manner as the transistor QN7, QNS, QN4 and QN6 using a word line WL20 in place of the word line WL00. However, it should be noted that there is not a transistor corresponding to the transistor QNS.

Figure 7:
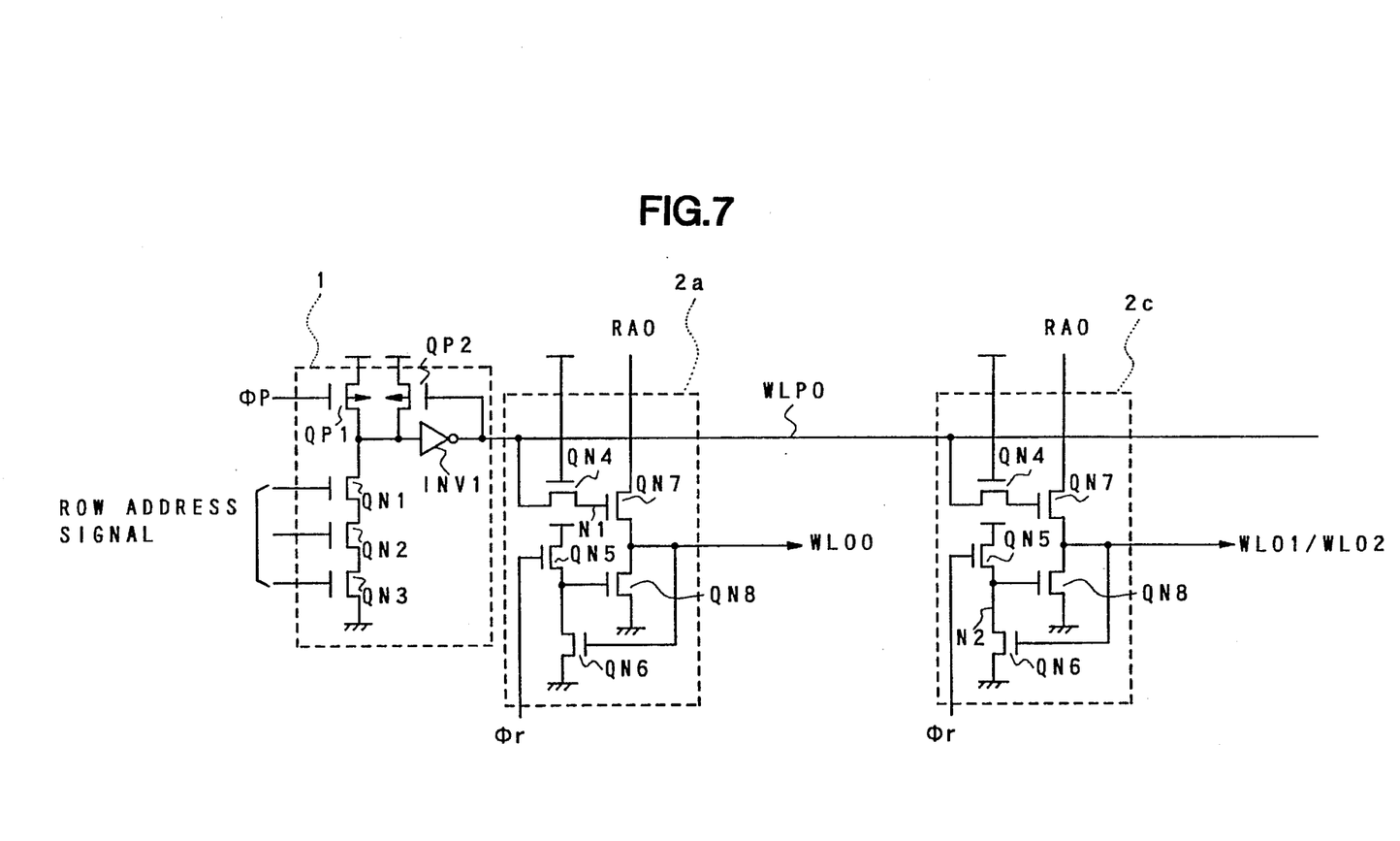
FIG. 7 is a schematic block diagram for describing the operation of the semiconductor memory device according to the embodiment of the present invention.

Next, a part of the row decoder 1 and a part of the word line driving circuits 2a and 2c will be described below with reference to FIG. 7. A parallel circuit of p-channel transistors QP1 and QP2 is connected between the power supply potential and one terminal of a series circuit of transistors QN1, QN2 and QN3, the other terminal being connected to the ground potential. The word line precharge signal φP is supplied to the gate of the transistor QP1 from the precharge circuit 8 by decoding a part of an external address and the row address signal is supplied to the gates of the transistors QN1, QN2 and QN3 from the row decoder 1 by decoding a row address of the external address other than lower two bits. The node between the parallel circuit and the series circuit is connected to an inverter INV1. The output of the inverter INV1 is connected to the gate of the transistor QP2 and supplied to the word line drive circuits 2a, 2b, 2c, 2d and 2e as the word line driving signal WLP0. Unlike the conventional semiconductor memory device, the word line reset signal is not connected to the node.

Figure 8A:
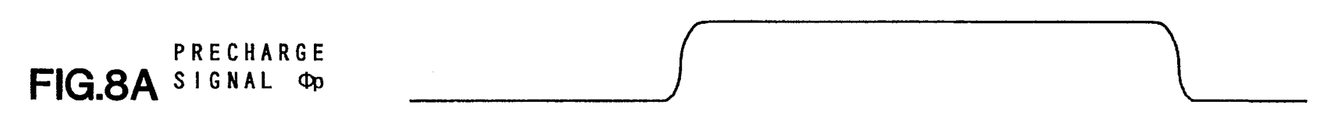
FIGS. 8A to 8F are timing charts for describing the operation of the semiconductor memory device according to the embodiment of the present invention.
Figures 8B, 8C:
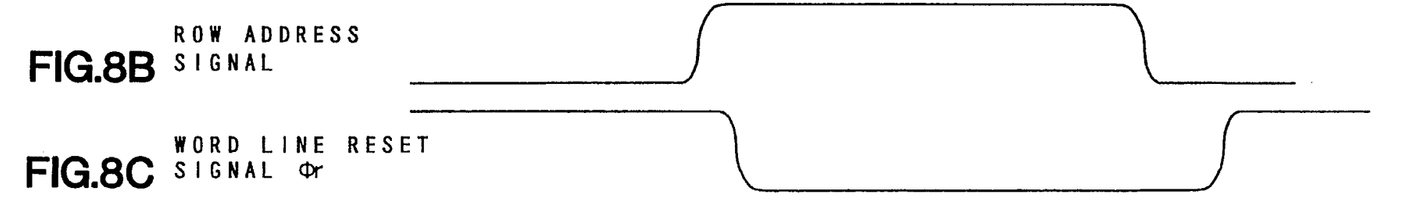
Figure 8D:
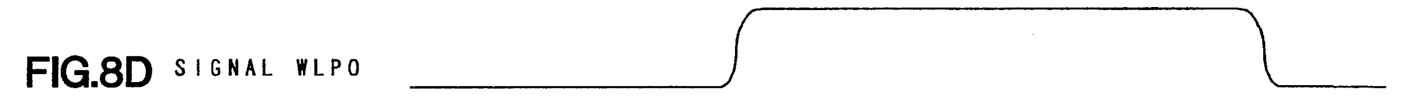

Next, the operation of the semiconductor memory device according to the embodiment of the present invention will be described below with reference to FIGS. 6, 7 and 8A to 8F. As shown in FIGS. 8A and 8C, in the reset mode, the word line precharge signal φP and the word line reset signal φr are in the ground potential level and the power supply potential level, respectively. Also, the row address signal is in the ground potential level as shown in FIG. 8B. Accordingly, because the transistors QN1 to QN3 are OFF state and the transistor QP1 is ON state, the signal WLP0 is in the ground potential level as shown in FIG. 8D and the transistor QN7 is in the OFF state.

When the memory cells are selected and accessed (in a select mode), the word line precharge signal φP goes to the power supply potential level as shown in FIG. 8A. As shown in FIG. 8B, after the transistor QP2 is completely changed into the off state, the external address is decoded by the row decoder 1 so that a row address signal is activated and supplied to the transistors QN1 to QN3 which are turned on. At this time, a part of the address signal is supplied to the circuit 5 for generating or activating the reset signal φr. Therefore, at substantially the same time as the row address signal is activated the word line reset signal φr goes to the ground potential level as shown in FIG. 8C. When the transistors QN1 to QN3 are turned on, the signal WLP0 goes to the power supply potential as shown in FIG. 8D. As a result of this, the transistor QN4 is turned on, so that the potential of a node N1 between the source of the transistor QN4 and the gate of the transistor QN7 is charged to a potential Vcc–Vth, where Vcc is the power supply potential and Vth is a threshold voltage of the transistor QN4.

Figure 8E:
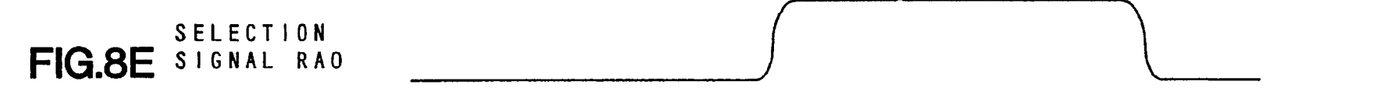
Figure 8F:
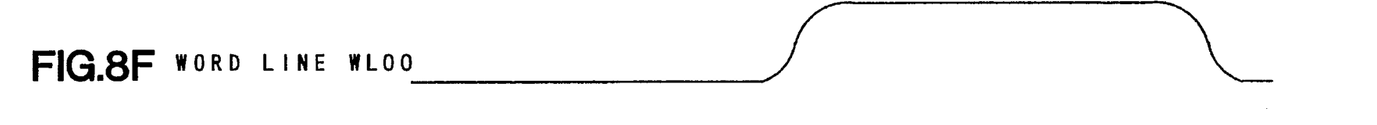

Next, when the lower two bits of the row address is decoded and the selection signal RA0 is activated by the drive current supply circuit 7a as shown in FIG. 8E, the transistor QN7 is turned on, so that the potential of the node N1 is raised to a further higher potential level than the boosted potential level of the selection signal RA0 by self-booting. In this manner, the potential level of the word line WL00 can be raised further faster to the same level as that of the signal RA0, as shown in FIG. 8F. Since the word line WL00 goes to the high potential level, the transistor QN6 is turned on so that the transistor QN8 is turned off. Since the reset signal φr is in the high potential level, the transistor QN5 is held in the ON state.

The similar operation is performed in the word line driving circuits 2c and 2e so that the word lines WL01. WL02 and WL03 are activated.

In this manner, when one word line driving signal, e.g., the signal WLP0 is activated, the divisional word lines, e.g., the word lines WL00, WL01, WL02 and WL03 are selected based on the selection signal RA0 at a time so that the memory cells connected to the activated divisional word lines can be selected. Data of each memory cell is transferred to the sense amplifier as well as data of the dummy cell and the data is sensed there to be outputted onto the data lines DL0 to DL7.

When the access to the memory cells is completed, the external address disappears so that the row address signal and the word line selection signal RA0 are reset to the ground potential level, as shown in FIGS. 8B and 8E, to thereby reset the precharge signal φP to the ground potential level as shown in FIG. 8A. As a result, the transistor QN1 to QN3 are turned off and the transistor QP1 is turned on so that the word line driving signal WLP0 goes to the ground potential level as shown in FIG. 8D. In addition, because the selection signal RA0 is reset to the ground potential level, the current supply from the circuit 7a is also stopped so that the transistor QN7 turns off. Since the word line reset signal φr goes to the power supply potential, as shown in FIG. 8C, the transistor QN5 turns on. Therefore, the transistor QN8 turns on so that the word line WL00 goes down to the ground potential level, as shown in FIG. 8F, and the transistor QN6 turns off.

On the other hand, the case that at least one of the transistors QN1, QN2 and QN3 maintains OFF state in the select mode because the memory cells are not selected which is converted to the word line driving signal WLP0, the word line driving signal WLP0 maintains the ground potential level by the INV1 and the transistor QP2 at the time of the select mode. Therefore, at the time of the precharge signal. φP going to the ground potential level, the gate of the transistor QN8 become high impedance state because the transistor QN7 maintains OFF state. The transistor QN8, however, maintains ON state because an effect of flip-flop consist of the transistors QN6 and QN8. Therefore, the level of the word line WL00 maintains the ground potential, thus, the word line WL00 is prevented from floating and is not influenced by noise.

The selection signal RA0 is not selected, the potential of the gate of the transistor QN8 changes to a high impedance state, but the word line WL00 is prevented from floating similarly above.

According to the present embodiment, as the word line driving signal and the word line reset signal is not complementary, the standby current fault is not caused due to a short circuit. In addition, as the bit between the word line driving signal lines is double compared to that of the conventional semiconductor memory device, there is a less possibility that the short circuit is formed due to contamination. Further, in a case where it is difficult to focus on the memory cell region and the peripheral region including the driving signal line at the same time because there is a step between the memory cell region and the peripheral region, there is no case of the formation of a short circuit even if the focussing on the memory cell regions is nor sufficiently performed because there is a great margin between the memory cell regions in the wiring pitch.

With respect to the increasing of the chip area, according to the present embodiment, the additional component is only one signal line for signal φr and a transistor circuit for resetting the word line in each driving circuit, compared with the conventional semiconductor memory device. However, the transistors in the transistor circuit does not require a great current supply capability and may be a transistor of the smallest size, so that the increase of the chip area can be minimum.

Figure 9:
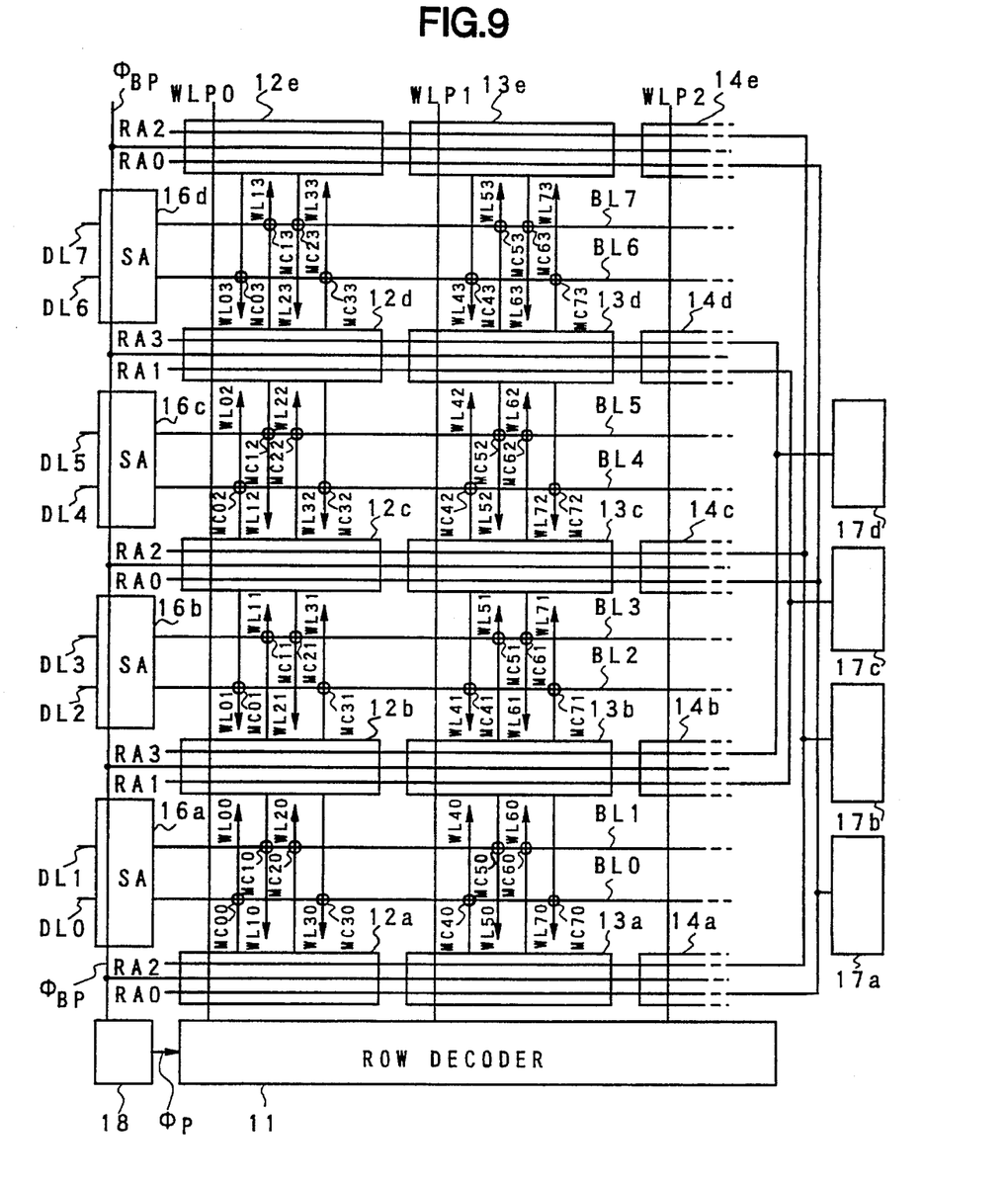
FIG. 9 is a block diagram showing a part of a semiconductor memory device according to another embodiment of the present invention.

Next, a semiconductor memory device according to the second embodiment of the present invention will be described with reference to FIG. 9. The same components as those in the first embodiment are assigned with the same reference numerals and the description will be omitted. In the second embodiment, the bit line precharge signal φBP which is generated by the precharging circuit 18 is used as the word line reset signal φr in place of that from the circuit 5. The bit line precharge signal φBp is activated at the time period for the reset mode and is inactivated at the time period for the select mode. Therefore, the signal φBP has substantially the same waveform as that of the reset signal φr from the circuit 5. The bit line precharge signal φBP is supplied to each of the sets of word line driving circuits in a column or bit line direction. In this embodiment, as the circuit 5 is removed the increase of the chip area can be further suppressed.

Figure 10:
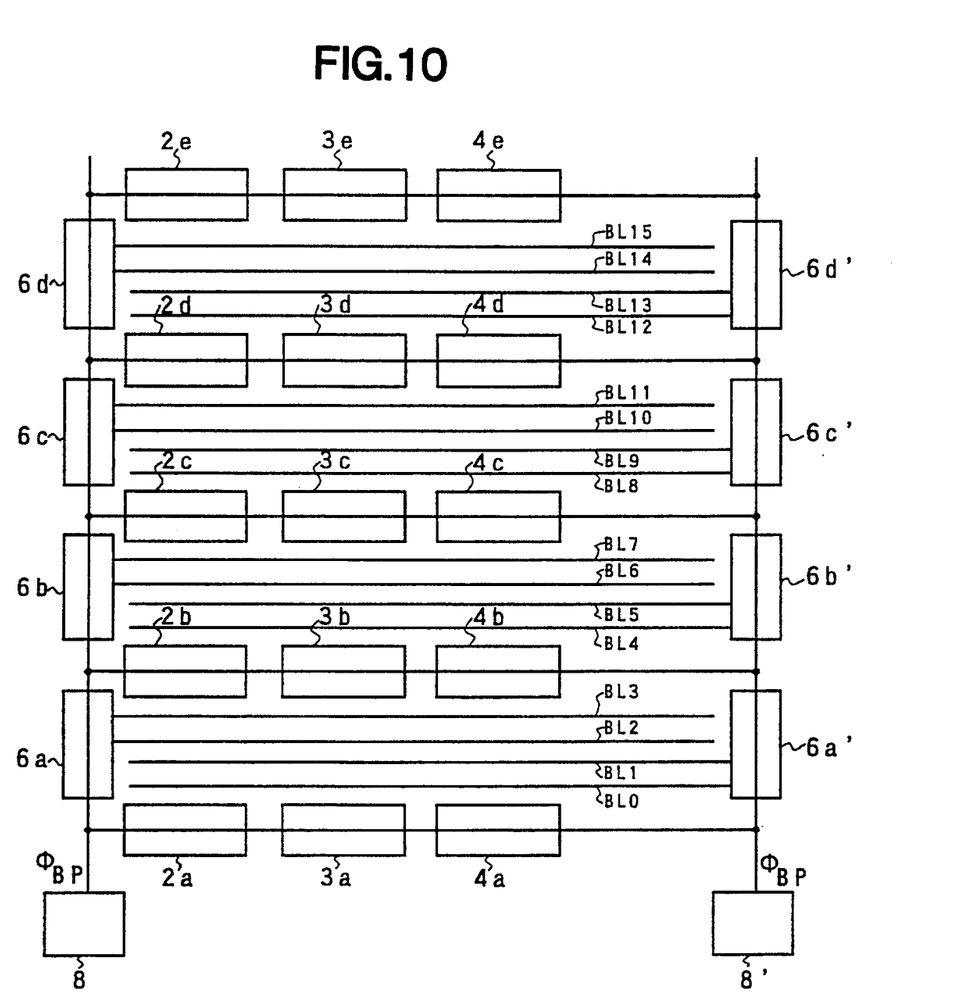
FIG. 10 is a block diagram showing a part of a semiconductor memory device according to still another embodiment of the present invention.

The embodiment presents the most advantageous effect when there is employed a shared sense amplifier system in which sense amplifiers are arranged on the both sides of the memory cell array. FIG. 10 shows a schematic diagram of a DRAM of the shared sense amplifier system to which the second embodiment is applied. In the DRAM of the shared sense amplifier system, as the sense amplifiers arranged on the both sides of the memory cell array are required to be activated at the same time, the bit line precharge signal generating circuits 8 and 8' are also activated at the same time. Therefore, the reset signal φBp is supplied to the word line driving circuits 2a to 4a; 2b to 4b, . . . from the both sides of the memory cell array so that the time constant upon the signal transfer can be sufficiently small. As a result, the bit line precharge signal lines may be formed of the material having a relatively high resistivity such as the material of a gate electrode, e.g., polysilicon or a laminated layer material of a polysilicon layer and a tungsten silicide layer. In this case, as the metal wiring is unnecessary, no contact hole is required to be provided, resulting in suppressing the increase of the chip area.

What is claimed is:

1. A semiconductor memory device comprising:

a) at least one word line;

b) at least one memory cell coupled to said word line;

c) a decoder circuit responding to address information to generate a word line drive signal taking one of an active level and an inactive level;

d) a signal generator generating a reset signal taking an active level in a reset mode and an inactive level in a selection mode; and e) a word line driver coupled to receive said word line drive signal and said reset signal and to said word line, wherein said word line driver includes:

1) a first drive circuit responding to said active level of said reset signal to drive said word line to a non-selection level during a whole period of time of said active level of said reset signal and maintaining said word line at said non-selection level when said word line drive signal and said reset signal are at said inactive level; and 2) a second drive circuit responding to said active level of said word line drive signal and said inactive level of said reset signal to drive said word line to a selection level.

2. A semiconductor memory device, comprising:

a) at least one word line;

b) at least one memory cell coupled to said word line;

c) a decoder circuit responding to address information to generate a word line drive signal taking one of an active level and an inactive level;

d) a signal generator generating a reset signal taking an active level in a reset mode and an inactive level in a selection mode; and e) a word line driver coupled to receive said word line drive signal and said reset signal and to said word line, wherein said word line driver includes:

1) a first drive circuit responding to said active level of said reset signal to drive said word line to a non-selection level and maintaining said word line at said non-selection level when said word line drive signal and said reset signal are at said inactive level; and 2) a second drive circuit responding to said active level of said word line drive signal and said inactive level of said reset signal to drive said word line to a selection level;

wherein said decoder circuit further generates a word line selection signal to one of an active level and an inactive level, and wherein said second drive circuit of said word driver drives said word line to said selection level when said word line drive signal and said word line selection signal are at said active level.

3. The memory device according to claim 2, wherein said first drive circuit includes:

a first transistor coupled between said word line and a first node supplied with said non-selection level and having a gate coupled to a second node;

a second transistor coupled between said first and second nodes and having a gate coupled to said word line; and a third transistor responding to said active level of said reset signal to charge said second node to such a level that renders said first transistor conductive, and wherein a second drive circuit includes:

a fourth transistor coupled between said word line and a third node supplied with said word line selection signal and having a gate coupled to a fourth node; and a fifth transistor responding to said active level of said word line drive signal to charge said fourth node to such a level that renders said fourth transistor conductive, said second transistor responding to said selection level of said word line to discharge said second node so that said first transistor is rendered nonconductive.

4. A semiconductor memory device, comprising:

a) at least one word line;

b) at least one memory cell coupled to said word line;

c) a decoder circuit responding to address information to generate a word line drive signal taking one of an active level and an inactive level;

d) a signal generator generating a reset signal taking an active level in a reset mode and an inactive level in a selection mode;

e) a word line driver coupled to receive said word line drive signal and said reset signal and to said word line, wherein said word line driver includes:

1) a first drive circuit responding to said active level of said reset signal to drive said word line to a non-selection level and maintaining said word line at said non-selection level when said word line drive signal and said reset signal are at said inactive level; and 2) a second drive circuit responding to said active level of said word line drive signal and said inactive level of said reset signal to drive said word line to a selection level; and f) at least one bit line coupled to said memory cell, said reset signal being further used for a pre-charge signal, said bit line being pre-charged by said active level of said reset signal.

5. A semiconductor memory device having a plurality of memory cell array blocks each including a plurality of word lines, a plurality of bit lines and a plurality of memory cells each disposed at a different one of intersections of said word and bit lines, a plurality of word line drivers each provided for an associated one of said memory cell array blocks, a first decoder circuit responding to first address information to generate and supply a word line drive signal in common to said word line drivers, said word line drive signal taking one of an active level and an inactive level, a second decoder circuit responding to second address information to generate and supply a plurality of word line selection signals to said word line drivers, each of said word line selection signals taking one of an active level and an inactive level, and a signal generator generating and supplying a reset signal in common to said word line drivers, said reset signal taking an active level in a reset mode and an inactive level in a selection mode, each of said word line drivers responding to said active level of said reset signal to drive each of said word lines to a non-selection level and responding to said active levels of said word line drive signal and an associated one of said word line selection signals to drive one of said word lines to a selection level while maintaining remaining one or ones of said word lines at said non-selection levels.

6. The memory device according to claim 5, A semiconductor memory device comprising:

a plurality of memory cell array blocks each including a plurality of word lines;

a plurality of bit lines and a plurality of memory cells each disposed at a different one of intersections of said word and bit lines;

a plurality of word line drivers each provided for an associated one of said memory cell array blocks;

a first decoder circuit responding to first address information to generate and supply a word line drive signal in common to said word line drivers, said word line drive signal taking one of an active level and an inactive level;

a second decoder circuit responding to second address information to generate and supply a plurality of word line selection signals to said word line drivers, each of said word line selection signals taking one of an active level and an inactive level; and a signal generator generating a supplying a reset signal in common to said word line drivers, said reset signal taking an active level in a reset mode and an inactive level in a selection mode;

wherein each of said word line drivers responds to said active level of said reset signal to drive each of said word lines to a non-selection level and responds to said active levels of said word line drive signal and an associated one of said word line selection signals to drive one of said word lines to a selection level while maintaining remaining one or ones of said word lines at said non-selection levels; and wherein each of said word line drivers includes a plurality of drive unit circuits each provided for an associated one of said word lines and including a first drive circuit driving an associated one of said word lines to said non-selection level, a second drive circuit driving said associated word line to said selection level, and a feedback circuit feeding a level relative to a level of said associated word line back to said first circuit to maintain said associated one word lines at said non-selection level.

7. A semiconductor memory device comprising:

a plurality of memory cell array blocks arranged in a matrix form of rows and columns and each including a plurality of word lines, a plurality of bit lines, and a plurality of memory cells each disposed at a different one of intersections of said word and bit lines;

a plurality of word line drivers each provided correspondingly to each of said memory cell array blocks;

a first decoder circuit responding to first address information to generate a plurality of word line drive signals, each of said word line drive signals being connected in common to ones of said word line drivers, which ones are arranged in a same row and one of said word line drive signals taking one of an active level and an inactive level;

a second decoder circuit responding to second address information to generate a plurality of word line selection signals, selected ones of said word line selection signals being connected in common to ones of said word line drivers, which ones are arranged in a same column and one of said word line selection signals taking one of an active level and an inactive level; and a signal generator generating and supplying a reset signal in common to said word line drivers, said reset signal taking an active level in a reset mode and an inactive mode in a selection mode;

each of said word line drivers responding to said active level of said reset signal to drive each of said word lines of an associated one of said memory cell array blocks to a non-selection level and responding to said active levels of an associated one of said word line drive signals and an associated one of said word line selection signals and further to said inactive level of said reset signal to drive one of said word lines of the associated memory cell array blocks to a selection level while maintaining remaining one or ones of said word lines at said non-selection level.

8. The memory device according to claim 7, wherein each of said bit lines is precharged in response to said active level of said reset signal.

* * * * *